United States Patent [19]
Hshieh et al.

[11] Patent Number: 5,689,128
[45] Date of Patent: Nov. 18, 1997

[54] HIGH DENSITY TRENCHED DMOS TRANSISTOR

[75] Inventors: Fwu-Iuan Hshieh, Saratoga; Mike F. Chang, Cupertino; Kuo-In Chen, Los Altos; Richard K. Williams, Cupertino; Mohamed Darwish, Saratoga, all of Calif.

[73] Assignee: Siliconix incorporated, Santa Clara, Calif.

[21] Appl. No.: 533,814

[22] Filed: Aug. 21, 1995

[51] Int. Cl.⁶ .................... H01L 29/76; H01L 29/94; H01L 31/062; H01L 31/113
[52] U.S. Cl. ............ 257/331; 257/329; 257/330; 257/341
[58] Field of Search ........................ 257/329, 330, 257/331, 332, 339, 341, 342

[56] References Cited

U.S. PATENT DOCUMENTS

| | | | |
|---|---|---|---|
| 4,931,408 | 6/1990 | Hshieh | 437/44 |
| 5,298,442 | 3/1994 | Bulucea et al. | 437/40 |
| 5,304,831 | 4/1994 | Yilmaz et al. | 257/341 |
| 5,316,959 | 5/1994 | Kwan et al. | 437/40 |
| 5,341,011 | 8/1994 | Hshieh et al. | 257/330 |
| 5,404,040 | 4/1995 | Hshieh et al. | 257/341 |
| 5,410,170 | 4/1995 | Bulucea et al. | 257/330 |
| 5,429,964 | 7/1995 | Yilmaz et al. | 437/41 |
| 5,468,982 | 11/1995 | Hshieh et al. | 257/331 |
| 5,474,943 | 12/1995 | Hshieh et al. | 437/40 |
| 5,479,037 | 12/1995 | Hshieh et al. | 257/328 |
| 5,486,772 | 1/1996 | Hshieh et al. | 324/769 |

FOREIGN PATENT DOCUMENTS

| | | | |
|---|---|---|---|
| 57-153469 | 9/1982 | Japan | 257/341 |
| WO93/03502 | 2/1993 | WIPO | 257/332 |

*Primary Examiner*—Steven H. Loke
*Attorney, Agent, or Firm*—Skjerven, Morrill, MacPherson, Franklin & Friel; Norman R. Klivans

[57] ABSTRACT

The cell density of a trenched DMOS transistor is increased by overcoming the problem of lateral diffusion of deep P+body regions. This problem is solved in three versions. In a first version, the deep P+body region is formed using a high energy implant into a single epitaxial layer. In a second version, a double epitaxial layer is used with a somewhat lower but still high energy deep P+body implant. In a third version, there is no deep P+body implant but only the double epitaxial layer is used. The cell density is improved to more than 12 million cells per square inch in each of the three versions.

7 Claims, 1 Drawing Sheet

HIGH DENSITY TRENCHED DMOS TRANSISTOR

BACKGROUND OF THE INVENTION

1. Field of the Invention

This invention relates to transistors, and more specifically to a high density trenched DMOS transistor.

2. Description of the Prior Art

DMOS (diffused metal oxide semiconductor) transistors are well known. Typically, these transistors are used in integrated circuits or for power transistors. Some DMOS transistors are trenched transistors; the gate electrode is a conductive material, typically polycrystalline silicon (polysilicon), located in a trench in the transistor substrate, where the sidewalls and bottom of the trench are insulated with silicon dioxide. The trenched structure increases transistor density, i.e. reduces the surface area consumed by the polysilicon gate of each transistor. Typically such transistors are used in low voltage applications where a transistor includes a large number (thousands) of cells. Each cell is defined by a source region diffused into the substrate and by the gate electrode trenches.

In typical DMOS transistors using a trenched gate electrode, in order to avoid destructive breakdown occurring at the bottom of the trench into the underlying drain region, such transistors are fabricated so that a P+deep body region extends deeper than does the bottom of the trench into the substrate (drain region). Thus rather than destructive breakdown occurring at the trench bottom, instead avalanche breakdown occurs from the lowest portion of this P+deep body region into the underlying drain region. However due to device physics limitations, the cell density of such transistors is thereby restricted by lateral diffusion of this P+deep body region. That is, in order to provide a P+deep body region that extends deep enough into the substrate, the drive in step causes this P+deep body region to diffuse laterally. If it diffuses too far laterally, it may coalesce with an adjacent P+deep body region and degrade transistor performance.

Hence, in order to allow deep enough extension of the P+deep body region into the substrate, the transistor cells each must be relatively large in surface area so that the lateral diffusion does not allow such coalescing. This increases the surface area consumed by each cell, or in other words increases the size of the transistor. As is well known, it is a primary goal of power MOSFET fabrication to minimize chip surface area. This lateral diffusion of the P+deep body region prevents optimization of transistor density and hence wastes chip surface area.

SUMMARY

In accordance with the invention, cell density is increased in a DMOS transistor. In some embodiments this is accomplished by providing a very narrow (in lateral dimension) P+deep body region with little or no lateral diffusion. In a first embodiment, the P+deep body region is implanted at high energy (i.e. 140 to 160 KeV) so as to drive the P+deep body region down further into the substrate. This is approximately three times the conventional implantation energy for such a P+deep body region. This deep (high energy) implantation is performed after the P body diffusion and is usually carried out at high temperature. This reduces the amount of the P+deep body diffusion, and achieves the final desired depth of the P+deep body region with lower subsequent temperature cycles.

In a second embodiment, in addition to the high energy P+deep body implant, a double epitaxial layer is provided underlying the body region, with the P+deep body P+region not extending below the depth of the trench. Instead, the double epitaxial layer provides the desired current path away from the bottom of the trenches. In the second embodiment, the P+deep body implant is high energy but is shallower in depth than in the first embodiment due to less diffusion.

In a third embodiment, there is no P+deep body implantation at all and instead only the double epitaxial layer is used underneath the body region.

It has been found that in accordance with the invention, cell density may be improved to e.g. greater than 12 million cells per square inch. Advantageously in accordance with each of the three embodiments, the destructive breakdown at the bottom of the trench (characterized by the accompanying gate oxide rupture due to an excessive local electric field) is avoided.

In the second embodiment the double epitaxial layer includes a first drift region and a second drift region where the second drift region is doped at a concentration intermediate that of the substrate and the first drift region, and is formed on the first drift region. Maximum thickness of the second drift region is 7 µm. The more highly doped portion of the body region extends to within 1.5 µm of the first drift region. Moreover the more highly doped portion of a body region has a dopant concentration of at least $10^{19}/cm^3$.

DETAILED DESCRIPTION OF THE PREFERRED EMBODIMENTS

Figure 1:
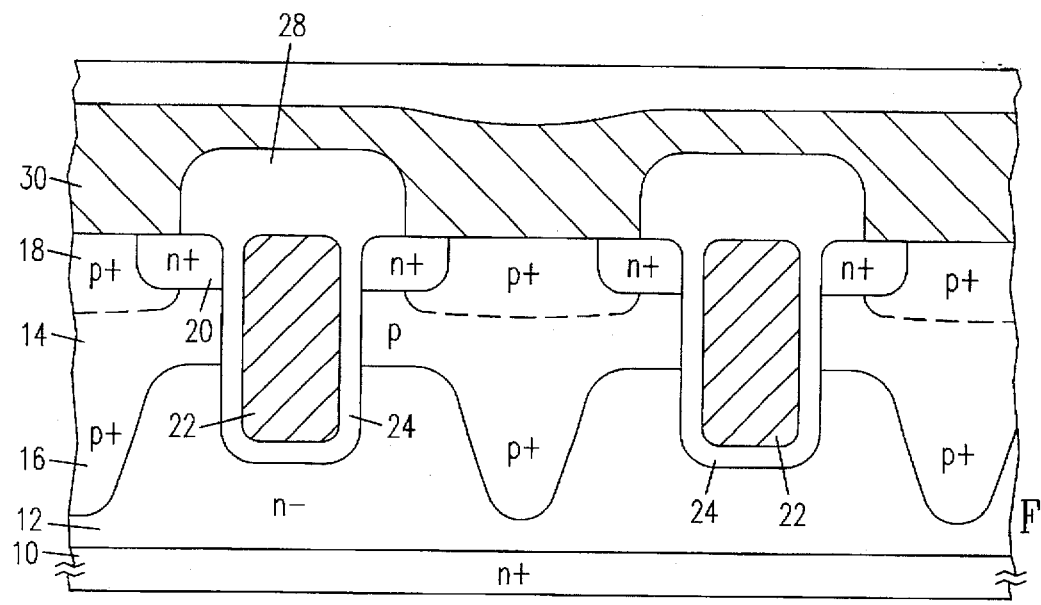
FIG. 1 shows a cross-section of a transistor in accordance with the first embodiment of the invention using a high energy P+deep body implant.

FIG. 1 shows a cross-section of a transistor in the first embodiment of the invention. It is to be understood that this cross-section is drawn conventionally showing a portion of several cells of a typical transistor which may include thousands of such cells. However, a single cell transistor is also possible. Also, while the present disclosure is directed to a transistor having a negatively (N) doped substrate, a positively (P) doped body region and an N doped source region, it is to be understood that complementary devices are also possible wherein each doping type is reversed in terms of conductivity type.

Also, the cross-sections shown here are not drawn to scale but are intended to be illustrative. While the various transistor doped regions shown here are conventionally delineated by lines, this is intended to be illustrative rather than representative. In the figures, identical reference numbers used in various figures are intended to denote similar structures for convenience of understanding. Also, the various parameters disclosed herein for thicknesses, depths, widths, doping concentrations and dosages and implantation energies are illustrative rather than limiting. Also, various materials may be used for the positive and negative type dopants. While the substances conventionally used for these dopant types may be used, this is not limiting.

FIG. 1 therefore shows a cross-section of several cells of the transistor which includes a drain region 10 N+doped to a resistivity of 1 to 5 milliohm·cm and of conventional thickness. Conventionally a metallized drain electrode (not shown) is formed on the bottom surface of this drain region 10 as an electrical contact thereto. Grown on the drain region 10 (substrate) is an N−doped epitaxial layer 12 (this need not be an epitaxial layer but is conventionally so formed) which has a resistivity of 0.7 to 1.0 ohm·cm and hence a typical dopant level of $5 \times 10^{15}$ to $1 \times 10^{16}/cm^3$. The N−doped portion of the epitaxial layer in the transistor is called a drift region. The epitaxial layer 12 has a total thickness typically of 8 to 12 μm.

A P doped body region 14 is formed in the upper portion of the epitaxial layer 12. A typical dopant level of the body region 14 is $5 \times 10^{15}/cm^3$. Included as a part of the body region 14 is a P+deep body region 16 which has a total depth from the principal surface of the semiconductor body of about 2.5 μm. A typical doping level of the P+deep body region 16 is $2 \times 10^{19}/cm^3$.

Penetrating from the principal surface of the semiconductor body into the drift region 12 is a set of trenches. Each trench is lined with a gate oxide layer 24 which is typically 0.07 μm thick and each trench is filled with a conductive doped polysilicon gate electrode 22. A typical depth of each trench is 1 to 2 μm. Typically therefore the P+deep body region extends 0.5 μm below the bottom of the trench. Thus the P+deep body region 16 approaches to within 2 μm of drain region 10. P+deep body region 16 is formed by a high energy implant, as described below.

Formed in the upper portion of the epitaxial layer 12 are N+doped source regions 20, having a typical depth of 0.5 μm. A typical doping level of the N+source regions 20 is $6 \times 10^{19}/cm^3$ at the principal surface. Penetrating through the middle of each source region 20 is a trench in which is formed a conductive gate electrode 22. Also formed immediately over each P+deep body region 16 is a P+doped body contact region 18, to promote electrical contact between the body region 14 and the overlying source-body metallization layer 30 which also contacts the source regions 20. Insulating the upper portion of each conductive gate electrode 22 is a BPSG (boro-phosphosilicate glass) insulating layer 28.

It is to be understood that the depiction herein is of the active portion of the transistor. Each transistor active portion is surrounded by a termination portion, typically including doped regions and sometimes a trench. Conventional terminations are suitable in accordance with the present invention and the termination portion hence is not portrayed herein.

Advantageously, this structure using the high energy implantation to achieve the deep P+body region 16 reduces further diffusion time to establish the final depth of region 16. That is, the high energy implantation step by itself establishes the ultimate depth of deep body region 16 and hence no additional diffusion is needed. This advantageously minimizes the lateral width (due to lateral diffusion) of each transistor cell, and hence maximizes cell surface area density.

A typical width of each trench is 0.8 to 1.0 μm. A typical cell pitch is 6.0 μm. This is an improvement over the pitch of a prior art cell not having the high energy P+deep body implant, which has a cell pitch of 7.5 μm.

Figure 2:
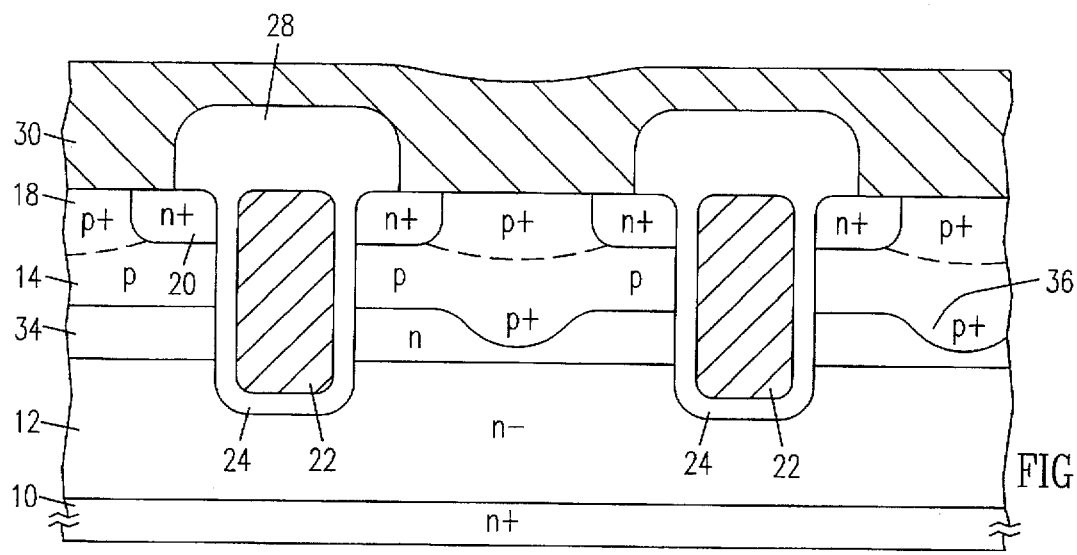
FIG. 2 shows a cross-section of a transistor in accordance with the second embodiment of the invention using a shallower P+deep body implant with a double epitaxial layer.

FIG. 2 depicts a transistor in the second embodiment of the invention. Most of the elements are the same and have similar reference numbers as in FIG. 1. However, this transistor also includes a second (upper) epitaxial layer (drift region) 34 which is N−doped to a concentration of $5 \times 10^{15}$ to $1 \times 10^{16}/cm^3$ and has a thickness of 1.0 μm. Also, each cell of this transistor includes a shallower P+deep body region 36 which does not extend as deep as the bottom of the trenches but instead only extends approximately 0.5 μm from the principal surface of the semiconductor body. A typical doping concentration of P+deep body region 36 is $2 \times 10^{19}/cm^3$. A typical depth is 2.5 μm. Again, in this case the non-destructive (avalanche) breakdown occurs between the P+deep body region 36 and the underlying drain region 10. This embodiment has one advantage over that of the first embodiment in that the parasitic JFET (junction field effect transistor) extending laterally from the P+deep body region 36 can be significantly reduced.

Figure 3:
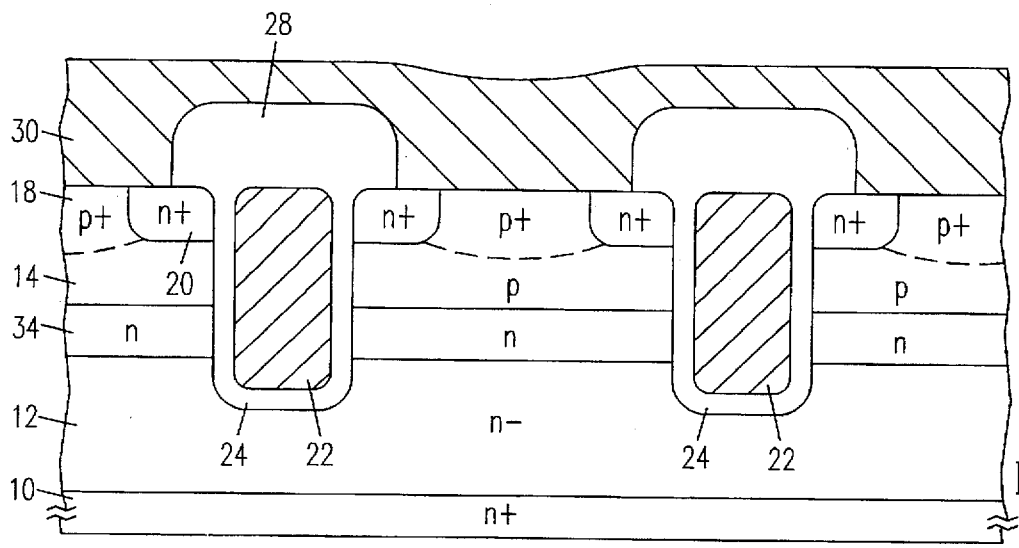
FIG. 3 shows a third embodiment of the invention with no deep P+body implant and with a double epitaxial layer.

The third embodiment shown in FIG. 3 includes the double epitaxial layer (drift region) structure of FIG. 2 but does not include a P+deep body region. Thus this is relatively simpler to fabricate than the embodiment of FIG. 2. It is believed however that the embodiment of FIG. 2 is likely to perform better in typical applications than the embodiment of FIG. 3, since the FIG. 3 transistor may have some residual problem of oxide rupture, i.e. destructive breakdown at the bottom of the trenches, due to the higher electric field between a P+deep body region and the drain region 10.

For the FIG. 3 embodiment, due to absence of any P+deep body region, only the principal surface will deplete in the body region 14. The intention is that there be avalanche breakdown where the P+body contact 20 approaches the underlying drift region 34. Otherwise the dimensions and parameters of the FIG. 3 transistor are similar to those of FIG. 2.

An exemplary process flow for fabricating the embodiments of FIGS. 1, 2, and 3 is described hereinafter. (These steps are not illustrated because each is conventional.) It is to be understood that this process flow is not the only way to fabricate the structures of FIGS. 1, 2, and 3, but is illustrative. Also, the various parameters given herein may be varied and still result in a structure and method in accordance with the present invention. The following process flow applies to all embodiments, with variations as described hereinafter.

One begins with an N+doped substrate 10 conventionally fabricated and having a resistivity of 1 to 5 milliohm·cm. An epitaxial layer 12 is then grown thereon having a resistivity of 0.7 to 1 ohm·cm and a thickness of 6 to 11 μm. For the embodiments of FIGS. 2 and 3, one then grows a second epitaxial layer 34 on top of the first epitaxial layer 12. The second epitaxial layer 34 is more strongly doped N type and has a resistivity of 0.5 to 0.6 ohm·cm. The total thickness of the epitaxial layer(s) in each of the embodiments of FIGS. 1, 2, and 3 is typically 1 to 2 μm.

The principal surface of the semiconductor body including the epitaxial layer(s) then has a conventional active mask layer formed thereon and patterned. This active mask may be oxide or other suitable material. This active mask defines the active portion of the transistor and hence masks off the termination portion thereof. It is to be understood that each of the embodiments of FIGS. 1, 2, and 3 illustrates only the active portion, with the termination portion not being shown as being outside the drawing edges.

A trench mask layer is then formed and patterned. Using the trench mask as a pattern, the trenches are then etched anisotropically. The trenches are then subject to a sacrificial oxide step to smooth their sidewalls and bottoms. The gate oxide layer 24 is then grown to a thickness of 0.05 to 0.07 μm. A layer of polysilicon is then formed on the principal surface of the semiconductor body and filling all the trenches. The polysilicon layer is then doped to achieve maximum conductivity with a N-type dopant.

Then a gate mask layer (poly mask) is formed over the entire surface of the polysilicon and patterned. This gate mask is then used to etch away the polysilicon except from the trenches, while also leaving gate contact fingers on the principal surface connecting the gate electrodes in the various trenches.

Then a blanket P type implant forms the P doped body region 14. This implant uses a dosage of $10^{13}$ to $10^{14}/cm^2$ at an energy of 50 to 60 KeV, typically using boron as a dopant for an N-channel device.

Next, a P+region mask layer is formed and patterned, masking off all portions of the principal surface of the semiconductor body except where the P+regions are to be formed. As shown, typically these P+regions are located intermediate each adjacent pair of trenches. After patterning of this mask layer, the P+implant is performed using boron as a dopant. In the embodiments of FIGS. 1 and 2 this implantation uses an energy of 140 to 160 KeV and a dosage of $5\times10^{15}$ to $1\times10^{16}/cm^2$. For the embodiment of FIG. 3, this uses a lower implant energy of 50 to 60 KeV and a dosage of $5\times10^{15}$ to $1\times10^{16}/cm^2$. The P+dopant is boron.

Thus FIG. 1 and FIG. 2 represents a high energy P+implant, and FIG. 3 a low energy P+implant. In each case the P+implant forms the P+doped body contact region 20, and in the case of FIGS. 1 and 2 it also at the same time forms the deep body P+regions respectively 16 and 36.

Then the P+region mask is stripped and an N+source region mask layer is formed and patterned to define the N+source regions 20. The N+source implant is then performed at an energy level of 80 to 100 KeV and a dosage of $5\times10^{15}$ to $8\times10^{18}/cm^2$, the dopant being arsenic.

The N+source mask is then stripped and a trench mask layer is formed and patterned to define the trenches.

Next, a layer of boro-phosphosilicate glass (BPSG) is conventionally deposited and doped. This layer has a thickness of 1 to 1.5 µm. A BPSG mask layer is then formed and patterned over the BPSG layer and then the BPSG mask is used to etch the BPSG, defining BPSG regions 28 insulating the top side of each conductive gate electrode 22.

Then conventional steps complete the device, i.e. stripping the BPSG mask, depositing the source-body metal layer, and masking the metal layer to define source-body contacts 30. Then a passivation layer is formed and a pad mask is formed and patterned and used to define the pad contacts through the passivation layer.

It is to be understood that the formation of the metal layer 30 has a corresponding step to form the contact to drain 10 (not shown) on the backside of the substrate.

Thus essentially a single process flow with variations in terms of (1) the P+high/low energy implantation energies and (2) formation of a single or double epitaxial layer, is used to form each of the embodiments of FIGS. 1, 2, and 3.

This disclosure is intended to be illustrative and not limiting; further variations and modifications will be apparent to one skilled in the art in the light of this disclosure and are intended to fall within the scope of the appended claims.

We claim:

1. A field effect transistor comprising:

a substrate of a first conductivity type;

a first drift region of the first conductivity type having a lower dopant concentration than the substrate and formed on the substrate;

a second drift region of the first conductivity type having a dopant concentration intermediate that of the substrate and the first drift region, and overlying the first drift region;

a body region of a second conductivity type and overlying the second drift region;

a conductive gate electrode extending from a principal surface of the body region into the first drift region; and a source region of the first conductivity type adjacent the conductive gate electrode at the principal surface of the body region.

2. The transistor of claim 1, wherein a portion of the body region which has a higher dopant concentration than that of a remaining portion thereof extends deeper into the second drift region than does the remaining portion of the body region.

3. The transistor of claim 2, wherein the portion of the body region having a higher dopant concentration extends to within 1.5 µm of the first drift region.

4. The transistor of claim 2, wherein the portion of the body region having a higher dopant concentration has a dopant concentration of at least $10^{19}/cm^3$.

5. The transistor of claim 1, further comprising a body contact region of the second conductivity type formed in the body region at the principal surface of the body region and having a higher dopant concentration than that of an adjacent part of the body region.

6. The transistor of claim 1, wherein a surface area of the transistor is less than $\frac{1}{12}$ million of a square inch.

7. The transistor of claim 1, wherein a maximum thickness of the second drift region is 7 µm.

* * * * *

UNITED STATES PATENT AND TRADEMARK OFFICE
CERTIFICATE OF CORRECTION

PATENT NO.    :   5,689,128
DATED         :   November 18, 1997
INVENTOR(S)   :   Fwu-Iuan Hshieh et al.

It is certified that error appears in the above-identified patent and that said Letters Patent is hereby corrected as shown below:

Column 4, line 15, delete "spitaxial" and substitute --epitaxial--.

Signed and Sealed this

Fifth Day of January, 1999

Attest:

Attesting Officer

*Acting Commissioner of Patents and Trademarks*